United States Patent [19]

Sawa

[11] 4,295,371

[45] Oct. 20, 1981

[54] TEMPERATURE DETECTING DEVICE

[75] Inventor: Hiroshi Sawa, Yokohama, Japan

[73] Assignee: Hochiki Corporation, Tokyo, Japan

[21] Appl. No.: 139,524

[22] Filed: Apr. 11, 1980

[30] Foreign Application Priority Data

Jun. 22, 1979 [JP] Japan ............................ 54-85583[U]

[51] Int. Cl.³ ................................................ G01K 7/00
[52] U.S. Cl. ............................ 73/359 A; 73/362 SC
[58] Field of Search ................. 73/359 A, 359 R, 354, 73/DIG. 9, 341, 362 SC

[56] References Cited

U.S. PATENT DOCUMENTS

| | | | |
|---|---|---|---|
| 3,123,996 | 3/1964 | Musial | 73/359 R |
| 3,159,032 | 12/1964 | Rademacher et al. | 73/359 R |
| 3,217,543 | 11/1965 | Van Haagen | 73/359 R |
| 3,882,727 | 5/1975 | Clakk et al. | 73/359 R |
| 3,996,071 | 12/1976 | Klicks et al. | 73/359 A |
| 4,179,309 | 12/1979 | Hance et al. | 73/359 R |

Primary Examiner—Donald O. Woodiel
Attorney, Agent, or Firm—Sughrue, Mion, Zinn, Macpeak and Seas

[57] ABSTRACT

A temperature detecting device having rapid temperature sensing characteristics and with a fully protected temperature sensitive element. A transistor pellet potted in a resin casing having at least one thin wall is mounted in a metal protective tube in thermal contact provided through a small amount of filler material of high thermal conductivity. A heat collector is disposed around the protective metal tube in close thermal contact therewith. The edges of the heat collector are held in position against ribs formed on an insulating casing by engaging members of a protective ring which fit into corresponding notches formed in the upper portion of the ribs. Protrusions formed on the protective member prevent its rotation and removal hence making the device essentially tamperproof.

9 Claims, 13 Drawing Figures

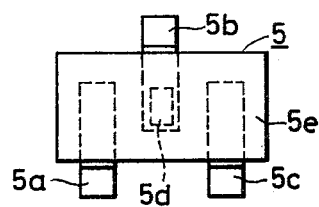
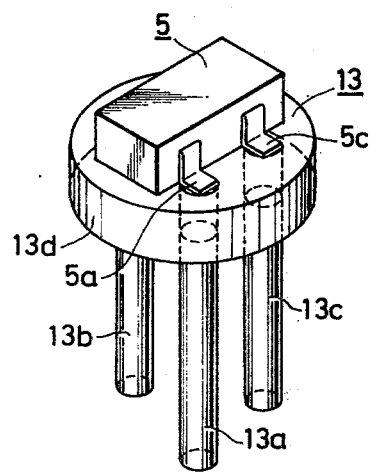
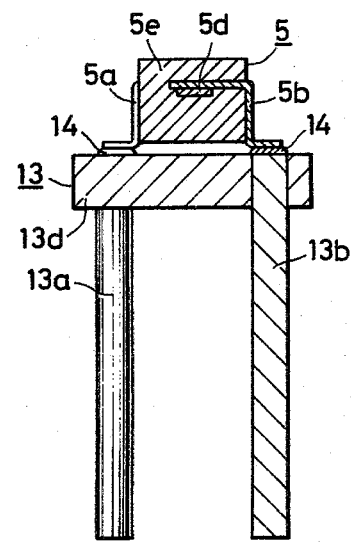

TEMPERATURE DETECTING DEVICE

BACKGROUND OF THE INVENTION

The present invention relates to a temperature detecting device. More particularly, the invention relates to a temperature detecting device for use in electronic fire alarm systems having a heat detecting section provided with a heat collector in which a semiconductor element is employed as a heat detecting element.

In general, it is well-known in the art that a forward voltage drop developed across the P-N junction of a semconductor diode will vary linearly over a wide range of temperature when the forward current thereof is held constant. Hence, semiconductor diodes have widely been used as heat detecting elements because of their stable and reliable characteristics. Since it is necessary to both detect the variations in temperature and then amplify the derived signal representing variations, it has been proposed that the P-N junction of a transistor be used as a semiconductor diode.

FIG. 1 is a schematic diagram including a cut-away portion which shows an example of a conventional temperature detecting device in which a transistor is employed as a heat detecting element. The conventional temperature detecting device includes, as shown in FIG. 1, a casing 1 housing a reference voltage generating circuit, a comparator circuit, a switching circuit and the like, and a metal protective tube 2 having a high heat conductivity mounted on the casing 1. So as to improve the heat response characteristics, a metal case hermetically sealed transistor 5 is provided at the top portion in the inner housing of the metal tube 2 held in place by an insulating adhesive agent.

More specifically, the metal hermetically sealed transistor is provided with three lines one of which is electrically connected to a metal case of the transistor 5 and an insulating material 11 such as alumina or the like is provided between the transistor 5 and the metal protective tube 2 so that they are electrically insulated. To provide the electrical insulation, a metal tube having a large inner diameter must be employed as the metal protective tube 2. This results in increasing the heat capacity of the metal protective tube 2 because of the presence of the insulating material 11. Furthermore, with the above described construction, the transistor pellet itself within the metal case is far from the metal protective tube 2 and, accordingly, the heat response characteristics are degraded.

Accordingly, the conventional temperature detecting device has a disadvantage in the lack of heat response characteristic. Therefore, the above-mentioned conventional temperature detecting device cannot be employed as a heat detecting section of a fire alarm system which must detect unusually rapid increases in ambient temperature.

In order to further improve the heat response characteristics of the heat detecting section, it has been proposed that a heat collector be provided for the heat detecting section of the temperature detecting device. With respect to the technique used for mounting the heat collector to the heat detecting section of the temperature detecting device employing a bimetallic device or a semiconductor as a heat detecting element, as disclosed in Unexamined Published Japanese Utility Model Application Nos. 25490/1975 and 98090/1976, the heat collector may be stacked on the heat detecting section or, as set forth in Unexamimed Published Japanese Utility Model Application No. 130691/1977, the heat collector may be secured to the heat detecting section by spot welding or it may be secured to the heating detecting section by an adhesive agent. However, these conventional techniques require a large number of manufacturing steps as a result of which manufacturing costs are high so that such techniques are not economical. In addition, as the heat collector is secured by the use of an adhesive agent, endothermic action of the adhesive agent results in a decrease of the heat collecting effect of the heat collector.

SUMMARY OF THE INVENTION

In view of the above-mentioned drawbacks accompanying the conventional temperature detecting device, an object of the invention is to provide an improved temperature detecting device having a heat detecting section employing a semiconductor as a heat detecting element which has excellent heat response characteristics, is economical, and is simple in construction.

The above object, as well as other objects, are accomplished by the provision of a temperature detecting device which includes a heat detecting section and a main body containing an electrical processing circuits. The heat detecting section includes a resin mold transistor produced by flat molding a transistor pellet, a metal protective tube one end of which is connected to the main body, a heat collector provided on the metal protective tube, and a stem composed of a substrate made of an insulating material and lead wires provided on the substrate with the lead wires electrically connected to the terminals of the transistor when the transistor is mounted on the substrate. The stem with the transistor is inserted into the metal protective tube in such a manner that the transistor directly contacts the heat collector or contacts it through the metal protective tube. Thereafter, the transistor, the substrate and the stem are fixedly secured to the metal protective tube by a filler. The heat collector may be secured to the metal protective tube by an adhesive agent or may be supported by a protective member on the main body.

BRIEF DESCRIPTION OF THE DRAWINGS

In the accompanying drawings:

FIG. 7 is a schematic top view of a resin mold transistor employed in the temperature detecting device of the invention;

FIG. 8 is a schematic perspective view illustrating a stem and a resin mold transistor mounted thereon;

FIG. 9 is a cross-sectional view of the stem and the transistor shown in FIG. 8;

DESCRIPTION OF THE PREFERRED EMBODIMENTS

Figure 1:
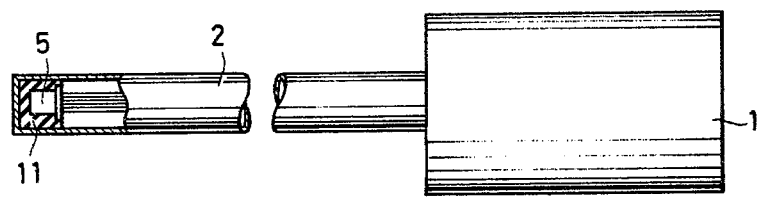
FIG. 1 is a schematic diagram including a cut-away portion showing a conventional temperature detecting device.
Figure 2:
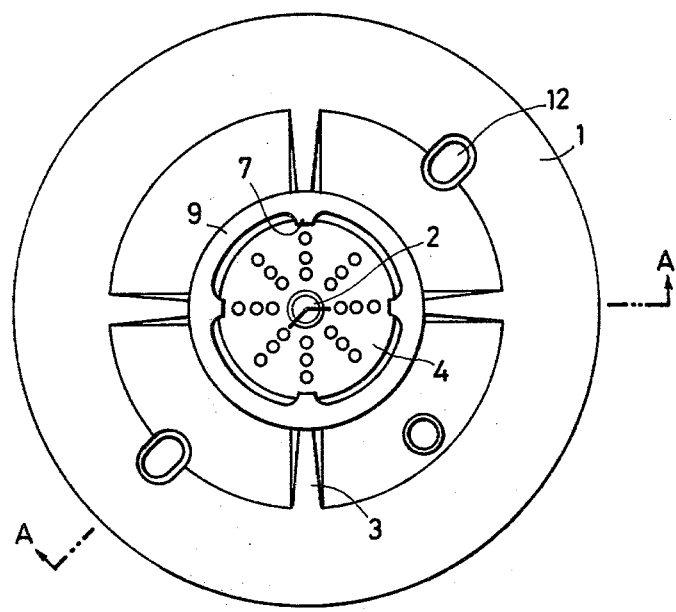
FIG. 2 is a top view of a first preferred embodiment of a temperature detecting device constructed according to the invention.
Figure 3:
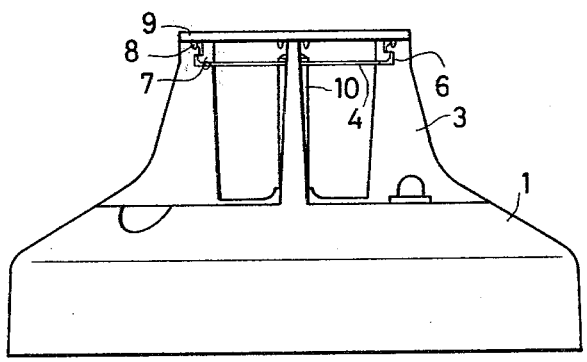
FIG. 3 is a side view of the temperature detecting device shown in FIG. 2.
Figure 4:
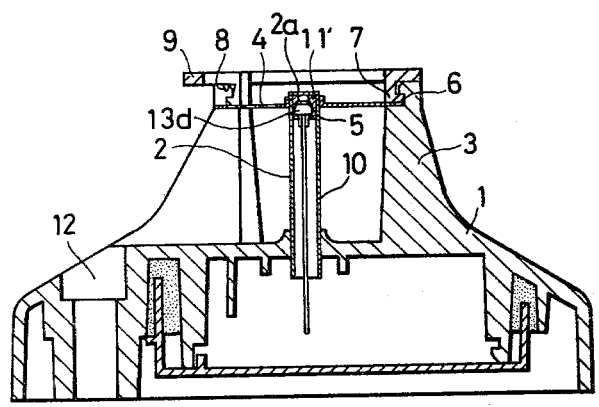
FIG. 4 is a cross-sectional view taken along a line IV—IV in FIG. 2.

The invention will be described with reference to the accompanying drawings.

In FIGS. 2 to 6, which show the first embodiment of a temperature detecting device constructed according to the invention, a heat collector 4 is engaged with a metal protective tube 2 having a high heat conductivity of a heat detecting section 10 which is mounted on a casing 1 of the temperature detecting device. The heat collector 4 is held to the casing 1 by the engagement of a protective member 9 which protects the heat collector 4 and the heat detecting section 10. Ribs are formed integrally with the casing 1.

The metal protective tube 2 which supports the heat collector 4, serves as a holder and case for the transistor 5 and the stem 13 thereby protecting the transistor 5 from damage caused by harmful gases. It is desired that the size of the metal protective tube 2 be as small as possible in order to minimize the heat capacity thereof. It is thus desirable that the inside diameter of the pipe 2 where the stem 13 is received and secured be minimized as well as the thickness of the peripheral wall of the tube 2. The pipe 2 is generally made of stainless steel. However, because stainless steel will corrode if exposed to a hydrogen chloride gas, a resin coating may be required to provide acceptable anti-corrosion protection. In this case, assuming for example that the surface of the tube 2 is coated with a resin having a high adhesion, it is possible to simultaneously use the resin to attach the heat collector to the tube 2.

The heat collector 4 is provided so as to absorb radiation heat or convection heat from high temperature air due to fire and to transmit the collected heat to the resin mold transistor 5. Therefore, it should be attached to the metal protective tube 2 in thermal contact therewith. The heat collector 4 is also made of stainless steel. Stainless steel has a disadvantage as described above and thus an anti-corrosion coating is required. However, because of manufacturing difficulties, the thickness of the coating may be too high at the end periphery of the heat collector 4 or it may be non-uniform. To overcome these difficulties, titanium may be used for the heat collector 4. This results in a heat collector having a high anti-corrosion property with respect to corrosive gases such as hydrogen chloride or the like.

The heat detecting section 10 is composed of a resin mold transistor 5, a stem 13, the heat collector 4 and the metal protective tube 2 containing the other elements therein so as to protect them from damage. The resin mold transistor 5 is mounted on a transistor holder 13d of the stem 13 with the terminals of the transistor 5 electrically connected to corresponding lead wires of the stem 13. The stem 13 together with the transistor 5 is inserted into the metal protective tube 2 in such a manner that the top surface of the transistor 5 is in contact with the bottom surface of the metal protective tube 2 whereafter the transistor 5 and the transistor holder 13d are fixedly secured to the metal protective tube 2 with a filler 11' of a resin such as an epoxy resin having a high thermal conductivity. By potting the transistor 5 and the transistor holder 13d of the stem 13 with the filler 11', a water-tight seal is provided and the anti-corrosion properties thereof are improved. It should be noted that these functions of the filler 11' can be sufficiently provided by potting only the transistor 5 and the transistor holder 13d of the stem 13. If the entire interior of the metal protective tube 2 were to be filled with the filler, this would result in a high heat capacity. Therefore it is necessary to avoid the use of excessive filler.

Figure 5:
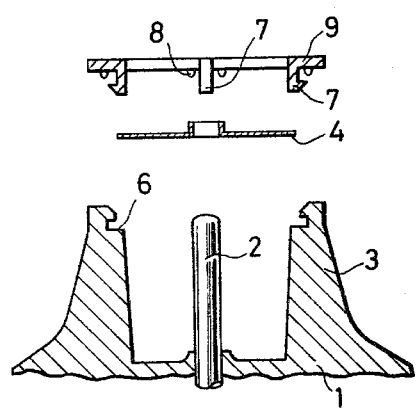
FIG. 5 is an exploded view of essential parts of the temperature detecting device shown in FIG. 4.
Figure 6:
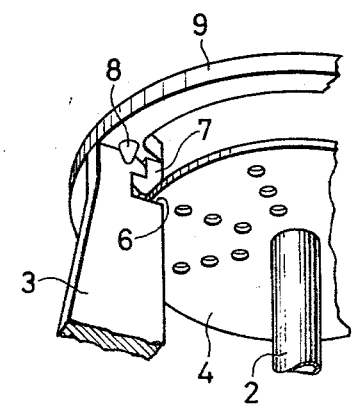
FIG. 6 is a schematic perspective view illustrating the mechanical connections between essential parts of the temperature detecting device shown in FIG. 5.

Shoulder portions 6 are formed at radial inside portions of the top portions of the ribs to receive the heat collector 4. The engaging portions of the protective member 9 are fittingly engaged with the shoulder portions 6 to hold in place the heat collector 4 to the ribs 3. That is, as shown in FIG. 5, the heat collector 4, which is made of aluminum or titanium, is generally disc shaped having a central opening formed therein to slip over the metal protective tube 2. It is fittingly engaged with the metal protective tube 2 of the heat detecting section 10 and is received by the shoulder portions 6. By the engagement of pawls provided on an inner peripheral portion of the protective member 9 with the shoulder portion 6, the heat collector 4 is held to the ribs 3.

More specifically, the protective member 9 has a ring-like shape with the engaging members 7 formed as pawls or resilient hooks which extend downwardly from the inner portion of the body of the protective member. The hooks are designed to engage with corresponding shoulder portions 6 formed at the upper part of each of the ribs 3. In the preferred embodiments of FIGS. 2–6, the ribs and engaging members 7 are four in number. However, the invention is not limited to this number as any practical number may be used depending upon the overall physical size of the device and the particular application at hand.

On either side of each of the engaging members 7 there is provided a conically shaped protrusion 8 which prevents the protective member 9 from rotating. The conical protrusions 8 extend from the lower surface of the protective member 9 at positions so as to closely abut the upper part of the ribs 3 above the shoulder portions 6 with one protrusion 8 on each side of each rib 3. With this construction, the device is essentially tamperproof as the engaging members 7 cannot be disengaged from the shoulder portions 6 and the protective member 9 cannot be rotated so that the protective member 9 cannot be removed once in place other than by physically breaking it.

The ribs 3 may be integrally formed with the casing 1 or may be provided as separate members which are separately attached to the casing 1. The protective member 9 may be provided with a separate set of engaging members which are used primarily to hold the heat collector 4 against the ribs if so desired. Also, the protrusions 8 may be omitted and replaced by protrusions adapted to be received at a corresponding hole provided in each rib. Moreover, the shape of the protective member may be modified to other than the ring shape described, again depending upon the application to which the invention is put. Still further, as shown in FIG. 5, the end of the protective tube 2 is closed while the heat collector 4 is provided with a small sleeve portion extending axially around its center mounting hole. The sleeve portion is fit around the upper part of the protective tube 2 extending outwardly. Other modifications are possible of this structure as discussed below including one in which the end of the tube 2 is open.

FIG. 7 is a top view of a preferred example of the resin mold transistor 5 used in the heat detecting section of the present temperature detecting device, FIG. 8 is a perspective view illustrating the coupling arrangement of the resin mold transistor 5 and the transistor 13d of the stem 13, and FIG. 9 is a cross-sectional view illustrating the coupling arrangement shown in FIG. 8.

The resin mold transistor 5 shown in FIGS. 7-9 is formed by integrally resin molding three bent metal electrodes 5a, 5b and 5c together with the transistor pellet 5d which is mounted on the middle electrode 5b. The resin body 5e fixes the electrodes with a predetermined distance with respect to each other and further isolates the transistor pellet 5d from the atmosphere. In addition, it is preferable that, in order to make the heat capacity of the molded resin body 5d as small as possible so as to thereby improve the heat response characteristics of the transistor 5, the molded resin body 5d be formed as thinly as possible. Especially, it is desirable that the thickness of the resin above the electrode 5b be as small as possible in order to improve the heat response characteristics of the transistor 5.

The stem 13 serves to support and hold the transistor 5 thereon and further to support the leads which couple the transistor 5 to electric processing circuits such as a reference voltage generating circuit or the like disposed within the casing 1 of the temperature detecting device. The stem 13 is produced by drilling holes at positions on the transistor holder 6d corresponding to the electrodes 5a, 5b and 5c, force-fitting lead wires 13a, 13b and 13c into the holes, and then attaching the lead wires 13a, 13b and 13c to the transistor holder 6d.

The resin mold transistor 5 is coupled to the upper surface of the stem 13 as shown in FIGS. 8 and 9 in such a manner that each electrode of the transistor is electrically connected to a corresponding lead wire of the stem 13 by soldering. The soldering is accomplished by disposing solder pieces 7 between the electrodes 5a, 5b and 5c and the lead wires 13a, 13b and 13c after which both the transistor 5 and the stem 13 are placed in an electric furnace thereby melting the solder and consequently electrically connecting the electrodes and the lead wires to each other.

Figure 10:
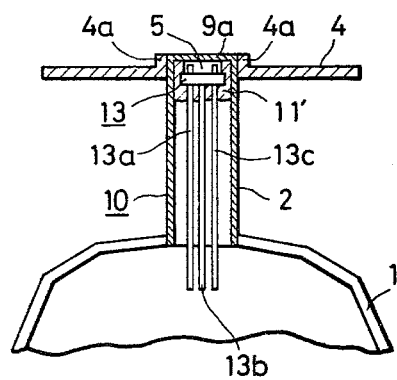
FIG. 10 is a cross-sectional view illustrating a second embodiment of a temperature detecting device according to the invention.

While FIGS. 2 through 6 show a first preferred embodiment of the temperature detecting device in which the heat collector 4 is attached to the casing 1 by the protective member 9, as shown in FIG. 10, engagement between the heat collector 4 and the casing 1 may also be implemented by fitting the center opening of the heat collector 4 through a circular guide portion 4a provided thereon on the metal protective tube 2 and then fixedly securing them by an adhesive agent having a high thermal conductivity.

The temperature detecting device provided with the heat detecting section 10 contsructed as described above operates to detect unusual ambient temperature changes and to produce in response to such an unusual change an emergency signal such as a fire warning signal which is sent to a control station. For this purpose, electric circuits (not shown) such as a reference voltage detecting circuit, a comparator circuit, a switching circuit and the like are provided in the casing 1. In addition, the casing is adapted to be mounted on a ceiling.

As is apparent from the above description, since the resin mold transistor is formed by merely resin molding the transistor pellet 5d, the size of the transistor is minimized. Consequently, the size of the metal protective tube 2 which encases the transistor 5 and the stem 13 is reduced and, accordingly, the heat capacity thereof is also made quite small. Furthermore, because the transistor pellet 5d is in close thermal contact with the bottom surface 2a of the tube 2 through a thin resin wall and the electrode 5b, the heat response characteristics of the heat detecting section are remarkably improved over prior art constructions. In fact, with a heat detecting section constructed according to the invention, abrupt unusual changes in ambient temperature which were difficult if not impossible to detect with a conventional temperature detecting device can be accurately detected. Hence, a temperature detecting device utilizing the heat sensing section of the invention will have a high sensitivity making it excellent for use in fire alarm systems.

Moreover, as the resin mold transistor 5 is mounted on the transistor holder 13d which is made of insulating material, when the stem 13 is inserted into the tube 2 together with the transistor 5, there is no need that attention be paid to maintaining an insulation condition between the transistor and the metal tube as in the conventional case in which a hermetically sealed type transistor is used. Therefore, the heat detecting section of the invention has definite manufacturing advantages over the prior art constructions.

Figure 11:
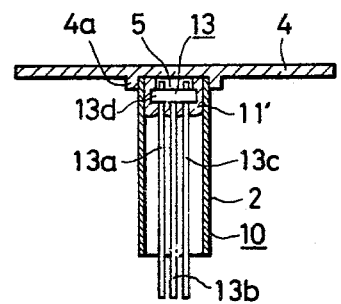
FIG. 11 is a cross-sectional view illustrating a third embodiment of a temperature detecting device according to the invention.

FIG. 11 is a cross-sectional view illustrating a third embodiment of a temperature detecting device according to the invention. In this embodiment, a metal tube 2' having open ends is employed as the metal protective tube 2. In the embodiment of FIG. 11, the heat detecting section 10 includes a metal protective tube 2', a heat collector 4 provided on one surface thereof with an annular guide portion so as to receive the end of the metal protective tube 2, a stem 13 and a resin mold transistor 5. The stem 13 with the transistor 5 is inserted into the metal protective tube 2' in such a manner that the upper surface of the transistor 5 is in thermal contact with the heat collector 4 and that the transistor holder 13d of the stem and the transistor 5 are attached to the tube 2' with a filler 11'.

With the above-described construction of the heat detection section 10, a tube having both ends open can be used as the metal protective tube 2 thereby resulting in a further reduction of manufacturing cost. In addition, because heat can be directly conducted from the heat collector 4 to the resin mold transistor 5, it is possible to yet further improve the heat response characteristics of the heat detecting section.

Figure 12:
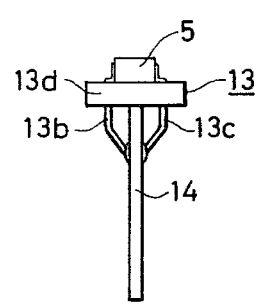
FIG. 12 is a side view of a second embodiment showing a stem employing a printed circuit instead of lead wires.
Figure 13:
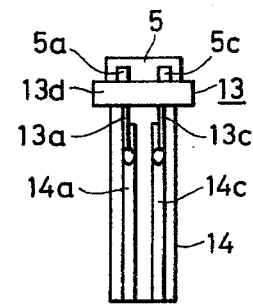
FIG. 13 is a front view illustrating the second embodiment of the stem shown in FIG. 12.

FIGS. 12 and 13 show a still further embodiment of the invention in which the stem is provided with a printed circuit board 14 upon which lead lines 14a to 14c have previously been printed. In this embodiment, lead wires 13a to 13c of the stem 13 are connected to corresponding lead lines 14a to 14c. In this embodiment, when the stem 13 is inserted into the tube 2', problems due to the bending of the lead wires 13a to 13c or in which the lead wires may accidentally contact the tube 2 and or become entangled resulting in a short circuit are eliminated. Furthermore, certain contact between the transistor 5 and the bottom of the tube 2 or the heat collector 4 is obtained.

As is clear from the above description, according to the invention there is provided a temperature detecting device using a semiconductor as a heat detecting element and which has a low heat capacity and thus good heat response characteristic and which is economical in comparison with the conventional devices of the same general type.

Yet further modifications of the preferred embodiments are possible within the scope of the present invention. Specifically, the heat detecting section 10 of the invention as described above utilizes a semiconductor detecting element. However, it is not intended that the scope of the invention be restricted to any particular type of heat sensing element. For example, a bimetallic heat sensing element can be used as well with the invention. Yet further, as shown in the view of FIGS. 2-6, the casing 1 is provided with a pair of threaded holes for fixedly securing the casing to a ceiling. Instead, a socket-type casing may be employed in which a plate adapted to receive the casing is mounted to the ceiling in advance.

What is claimed is:

1. A temperature detecting device comprising: casing means, said casing means being provided with a plurality of rib portions each having a receiving shoulder formed on an inside portion thereof; a protective tube formed of a material having a high thermal conductivity and being mounted upon said casing means centrally of said rib portions; heat detecting means disposed within said protective tube and in thermal contact with an end portion thereof; heat collecting means being received in said shoulder portions of said rib portions; and a protective member having portions thereof adapted to engage with said rib portions, said heat collecting means being fixedly supported on said casing means by engagement of said rib portions and said protective member.

2. The temperature detecting device of claim 1 wherein said protective member comprises engaging pawls adapted to engage with corresponding rib portions.

3. The temperature detecting device as claimed in claim 2 wherein said protective member is generally ring shaped.

4. The temperature detecting device of claim 3 wherein said protective member is provided with projections adapted to prevent the rotation of said protective member.

5. The temperature detecting device of claim 4 wherein said projections are positioned to abut sides of said rib portions.

6. The temperature detecting device of claim 4 wherein said projections mate with corresponding depressions in said rib portions.

7. The temperature detecting device of claim 1 wherein said heating detecting means comprises a semiconductor device mounted in a thermally conductive case and further comprising a thermally conductive adhesive material attaching said semiconductor device to said end of said protective tube, said adhesive material being confined to a small region at said end of said tube.

8. The temperature detecting device as claimed in claim 1 wherein said protective tube is formed of a metal and wherein said end of said tube is closed.

9. The temperature detecting device of claim 1 wherein said heat collector means is generally disc shaped with a central opening adapted to slip over said protective tube and having a sleeve portion extending in and axial direction from one side of said opening.

* * * * *